US007389460B1

(12) United States Patent
Demara

(10) Patent No.: US 7,389,460 B1
(45) Date of Patent: Jun. 17, 2008

(54) RUNTIME-COMPETITIVE FAULT HANDLING FOR RECONFIGURABLE LOGIC DEVICES

(75) Inventor: Ronald F. Demara, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 182 days.

(21) Appl. No.: 11/273,533

(22) Filed: Nov. 14, 2005

(51) Int. Cl.
G01R 31/28 (2006.01)
(52) U.S. Cl. ..................................... 714/733
(58) Field of Classification Search .............. 714/724, 714/725, 733
See application file for complete search history.

(56) References Cited

U.S. PATENT DOCUMENTS

| 6,530,049 | B1 | 3/2003 | Abramovici et al. ........ 714/725 |
| 6,550,030 | B1 | 4/2003 | Abramovici et al. ........ 714/725 |
| 6,668,237 | B1 * | 12/2003 | Guccione et al. ........... 702/119 |
| 6,718,496 | B1 | 4/2004 | Fukuhisa et al. ........... 714/733 |
| 6,839,873 | B1 | 1/2005 | Moore ........................ 714/725 |
| 6,874,108 | B1 | 3/2005 | Abramovici et al. ........ 714/725 |
| 7,111,213 | B1 * | 9/2006 | Dastidar et al. ............. 714/724 |
| 7,216,277 | B1 * | 5/2007 | Ngai et al. .................. 714/733 |
| 2005/0071716 | A1 | 3/2005 | Montagne et al. .......... 714/725 |
| 2005/0154552 | A1 | 7/2005 | Stroud et al. ............... 702/120 |

OTHER PUBLICATIONS

M. Abramovici, J. M. Emmert, and C. E. Stroud, "Roving STARs: An Integrated Approach To On-Line Testing, Diagnosis, and Fault Tolerance For FPGAs in Adaptive Computing Systems," *NASA/DoD Workshop on Evolvable Hardware*, 2001.

Actel Corporation, "Actel FPGAs Make Significant Contribution to Global Space Exploration," available at http://www.actel.com/company/press/_1999pr/SpaceContribution.html.

D. Keymeulen, A. Stoica, and R. Zebulum, "Fault-Tolerant Evolvable Hardware using Field Programmable Transistor Arrays," *IEEE Transactions on Reliability*, vol. 49, No. 3, Sep. 2000.

J. Lach, W.H. Mangione-Smith, and M. Potkonjak, "Low Overhead Fault-Tolerant FPGA Systems," *IEEE Transactions on VLSI Systems*, vol. 6, No. 2, Jun. 1998, pp. 212-321.

J.D. Lohn, G. Larchev, and R. F. DeMara, "A Genetic Representation for Evolutionary Fault Recovery in Virtex FPGAs," In *Proceedings of the 5th International Conference on Evolvable Systems (ICES)*, Trondheim, Norway, Mar. 17-20, 2003.

(Continued)

*Primary Examiner*—James C Kerveros
(74) *Attorney, Agent, or Firm*—Brian S. Steinberger; Phyllis K. Wood; Law Offices of Brian S. Steinberger, P.A.

(57) ABSTRACT

Methods, systems, apparatus and devices to provide autonomous self-repair for programmable logic. Using Competitive Runtime Reconfiguration, an initial population of functionally identical, yet physically distinct individual programmable logic configurations are produced at design time. During operation, individuals compete for selection based on a fitness function favoring fault-free behavior and any physical resource exhibiting an operationally-significant fault decreases the fitness of those configurations which use it. Through runtime competition, the presence of the fault becomes occluded from the visibility of subsequent operations. Offspring formed through crossover and mutation of faulty and viable configurations are reintroduced into the population to enable evolution of a customized fault-specific repair, realized as new configurations using normal throughput processing operations. In an embodiment, the error detection circuit is also checked for errors.

13 Claims, 7 Drawing Sheets

OTHER PUBLICATIONS

J.D. Lohn, G. Larchev, and R. F. DeMara, "Evolutionary Fault Recovery in a Virtex FPGA Using a Representation That Incorporates Routing," In *Proceedings of 17th International Parallel and Distributed Processing Symposium*, Nice, France, Apr. 22-26, 2003.

S. Vigander, *Evolutionary Fault Repair of Electronics in Space Applications*, Dissertation, Norwegian University Sci. Tech., Trondheim, Norway, Feb. 28, 2001.

Xilinx Inc., "Xilinx Launches New Era Of Digital Design In Aerospace And Defense With Introduction of QPRO Virtex-II Family," May 2004, available at: http://www.xilinx.com/prs_rls/end_markets/_0458qprovii.htm.

E.J. McCluskey, "Design Techniques for Testable Embedded Error Checkers", *IEEE Computer*, Jul. 1990.

Wei-Je Huang, Subhasish Mitra, and Edward J. McCluskey, "Fast Run-Time Fault Location in Dependable FPGAs", Center for Reliable Computing, Stanford University.

Mitra, S., and E.J. McCluskey, "Word-Voter: A New Voter Design for Triple Modular Redundant Systems," *18th IEEE VLSI Test Symposium*, pp. 465-470, Montreal, Canada, Apr. 30-May 4, 2000.

Mitra, S. and EJ McCluskey, "Which Concurrent Error Detection Scheme To Choose?," Proc. International Test Conf., pp. 985-994, 2000.

\* cited by examiner

RUNTIME-COMPETITIVE FAULT HANDLING FOR RECONFIGURABLE LOGIC DEVICES

FIELD OF THE INVENTION

This invention relates to reconfigurable and/or programmable logic devices and, in particular, to methods, systems, apparatus and devices for fault-handling in programmable logic devices such as Field Programmable Gate Arrays and Field Programmable Transistor Arrays including built-in testing and reconfiguration for autonomous fault detection and self-repair when a failure occurs during operation.

BACKGROUND AND PRIOR ART

Reliable embedded computing systems are vital to every sector of our economy and daily lives. They are frequently relied upon in mission-critical applications where safety of human life and material assets are at risk. Meanwhile, the worldwide market for programmable logic devices is about $3.5 billion and is forecasted to grow to approximately $4.5 billion in 2006 and $5.2 billion in 2007. Furthermore, field programmable gate arrays have also been displacing microcontrollers via processor softcores that configure only the necessary arithmetic/logic functional units within an embedded application.

Autonomous repair of field programmable gate arrays (FPGAs) is of particular interest in aerospace applications for both in-flight and Ground Support Equipment devices. SRAM-based FPGAs are of significant importance due to their high density and increasing use in mission-critical/safety-impacting applications. Meanwhile, they offer unlimited reprogrammability that can enable autonomous repair.

For in-flight applications, FPGA devices encounter harsh environments of mechanical and acoustical stress during launch, high doses of ionizing radiation, and thermal stress. Simultaneously, they are required to operate reliably for long mission durations with limited or absent capabilities for diagnosis/replacement and little onboard capacity for spares. Hence, recent research has focused on employing the reconfigurability inherent in field programmable devices to increase reliability and autonomy as described in D. Keymeulen, A. Stoica, and R. Zebulum, "Fault-Tolerant Evolvable Hardware using Field Programmable Transistor Arrays," IEEE Transactions on Reliability, (September 2000) Vol. 49, No. 3; S. Vigander, Evolutionary Fault Repair of Electronics in Space Applications, Dissertation, Norwegian University Sci. Tech., (Feb. 28, 2001), Trondheim, Norway; M. Abramovici, J. M. Emmert, and C. E. Stroud, "Roving STARs: An Integrated Approach To On-Line Testing, Diagnosis, and Fault Tolerance For FPGAs in Adaptive Computing Systems," NASA/DoD Workshop on Evolvable Hardware, (2001); J. D. Lohn, G. Larchev, and R. F. DeMara, "A Genetic Representation for Evolutionary Fault Recovery in Virtex FPGAs," In Proceedings of the 5th International Conference on Evolvable Systems (ICES), Trondheim, Norway, March 17-20, 2003; and J. D. Lohn, G. Larchev, and R. F. DeMara, "Evolutionary Fault Recovery in a Virtex FPGA Using a Representation That Incorporates Routing," In Proceedings of 17th International Parallel and Distributed Processing Symposium, Nice, France, Apr. 22-26, 2003.

Ideally, recovery would be performed with the faulty device remaining online whenever possible, but few attempt this. Using Roving Self-Test Areas (STARS), testing and diagnostic process takes place in the FPGA without disturbing the normal system operation. The entire chip is tested by roving the STARs across the FPGA. The STARS multi-level fault-tolerant technique allows using partially defective logic and routing resources for normal operation and providing longer mission life in the presence of faults. In addition, the dynamic fault-tolerant method ensures that spare resources are always present in the neighborhood of the located fault, thus simplifying fault-bypassing. However, effective use of STARS requires spare resources to be available to use as substitute resources when faults are detected. A problem encountered with STARS is that the quality of recovery is restricted by a fixed routing scheme that cannot adapt and detection latency for faults can be large.

Vigander's and Lohn's methods exhibit likelihood of recovery related to the FPGA's design complexity. In other words, they attempt to design an original repair where only a single failed configuration is available for adaptation. While the quality of recovery under evolutionary approaches cannot be guaranteed, static redundancy approaches like Lach's are either completely recovered or completely beyond recovery.

Evolutionary mechanisms can actively restore mission-critical functionality in SRAM-based reprogrammable devices. They provide an alternative to device redundancy for dealing with permanent degradation due to radiation-induced stuck-at-faults, thermal fatigue, oxide breakdown, electromigration, and other local permanent damage. Potential benefits include recovery without the increased weight and size normally associated with spares. Also, failures need not be precisely diagnosed due to intrinsic evaluation of the FPGA's residual functionality through assessment of the Genetic Algorithm (GA) fitness function.

Other prior art that is made of record include U.S. Patent Publication No. 2005/0154552 published on Jul. 14, 2005, discloses an emulation system for testing FPGAs that includes testing during the manufacturing process with roving self-test areas in different configurations. A major limitation is that the device does not include self-testing and reconfiguration in real time during normal operation of the device.

U.S. Patent Publication No. 2005/0071716 published Mar. 31, 2005, describes methods and system for verifying functionality of the logic elements and the reconfigurable interconnections prior to operational use of the device.

U.S. Pat. No. 6,874,108 issued on Mar. 29, 2005, describes a method of fault tolerant operation for a FPGA. The system tests an area of the device, identifies a fault and reconfigures the FPGA including estimating signal path delays and adjusting clock period or speed if required.

U.S. Pat. No. 6,839,873 issued on Jan. 4, 2005, describes a PLD having a built-in test function for testing the PLD which either passes or fails. There is no redundant circuit for self-repair or reconfiguration and the testing function is limited to during manufacturing and at start up to confirm device integrity. No provision for self-test during normal operation.

U.S. Pat. No. 6,718,496 issued on Apr. 6, 2004, describer a semiconductor device having an internal circuit to test, a redundant circuit for repairing the internal circuit and a test and switching for conducting the test and making the repair. The system also tests and changes the operating parameters including timing, input voltage to test semiconductor under different operating conditions. Testing is only performed during start-up operation and thus does not provide fault detection and reconfiguration during online operation.

U.S. Pat. No. 6,668,237 issued on Dec. 23, 2003, describes a testing system for testing PLDs. The test system, including hardware and software, is external to the device. The device is reconfigurable. Test and reconfiguration are not real-time and are not performed during normal operation of the device.

U.S. Pat. No. 6,550,030 issued on Apr. 15, 2005 and U.S. Pat. No. 6,530,049 issued on Mar. 4, 2003, describe an external self-test for FPLAs. The testing controller and memory are external. The test circuit configures a test area of the FPLA the reconfigures the FPLA for testing a next area until the entire FPLA is tested. The prior art fails to provide apparatus, methods, systems or devices for autonomous fault handling and self repair of programmable logic devices in-situ.

As for the actual error detection circuitry, Current approaches to fault-tolerant error detection can be broadly classified into coding-based approaches and redundancy based approaches. Concurrent Error Detection (CED) schemes are a general class of fault tolerant schemes that fall into either or both of these categories. In general, the operating principle of most CED schemes can be described as comparing some special characteristic of the actual output of a system that realizes a function in response to an input to a special characteristic computed by an alternate, predicted, output characteristic of the function in response to the same input. The special characteristic in question could be the parity of the output, a count of the 1's or 0's in output, or the conformance to pre-specified codes, such as the Berger code, or a specific m-out-of-n code disclosed in Mitra, S. and E J McCluskey, "Which Concurrent Error Detection Scheme To Choose?," Proc. International Test Conf., (2000) pp. 985-994. The comparison between the predicted output and the observed output is carried out using a comparator element, which is a hardware detector or error checker.

The redundancy in CED schemes can be spatial, where the hardware circuit-under-test is duplicated, or temporal, where the outputs may be buffered for future comparison. The comparator used in CED schemes vary in architecture depending on requirements. For example, the hardware comparators may be capable of bitwise output comparison, such as the two-rail checker described in E. J. McCluskey, "Design Techniques for Testable Embedded Error Checkers", IEEE Computer, July 1990.

Equality checkers or matchers compare two input words to determine whether corresponding bits from the words have the same value. The equality checker consists of series of XOR gates whose output should always be 0 when both inputs, from the two input words being compared, are equal. The outputs of the XOR gates comprise the inputs to an OR gate, whose output should be a zero as long as none of its inputs are a one. McCluskey shows that these circuits need complemented inputs, and a two-rail checker to be verifiable as a fully self-testing system. A two-rail checker is a circuit that checks that each pair of inputs has complementary values, and this is used to convert n pairs of signals into one pair of signals that are complementary if and only if all of the n input pairs are complementary. The two-rail checker can be made testable with the addition of a test signal, and two XOR gates.

The prior art checkers described are essentially only testable error checkers. In other words, they can be tested and verified to be error-free before being utilized in a larger system. These self-testing checkers, or more precisely, testable error checkers provide no guarantee of tolerating a fault which affects the checker if the fault occurs after the system is put into service. Another problem is that these checkers are essentially checking for the presence of invalid code words in the output of the circuit-under-test for at least one valid code-word input to the checker—they do not address the case where a component in the circuit-under-test may fail completely, after the system is placed in service. Subsequent work in CED schemes rely upon comparators that have been designed with this philosophy—that of self-testing checkers being defined as checkers that are testable using the checker itself, and some test input comprising of non-code words.

Triple Modular Redundancy TMR systems provide fault-tolerance capability by utilizing three functional replicas and a voter that chooses the majority output. The majority output is propagated in the hope that faults, if any, do not affect more than one of the three functional modules. This works satisfactorily in the case of a single-fault assumption, unless the fault induces a Common Mode Failure.

Voter designs include bitwise voters are majority voting systems that calculate the majority by comparing the output of the three modules in a bitwise fashion, and word-voters which compare entire variable-length words to arrive at a result as disclosed in Wei-Je Huang, Subhasish Mitra, and Edward J. McCluskey, "Fast Run-Time Fault Location in Dependable FPGAs", Center for Reliable Computing, Stanford University and Mitra, S., and E. J. McCluskey, "Word-Voter: A New Voter Design for Triple Modular Redundant Systems," 18th IEEE VLSI Test Symposium, (Apr. 30-May 4, 2000) pp. 465-470, Montreal, Canada. TMR systems with voters have a single point of failure—the voting element. If the logic elements used for the construction of the voter are subject to a failure, then the whole system would fail. Using redundant voters is a poor alternative, as it improves fault-tolerance, but does not guarantee the reliability of the results produced.

SUMMARY OF THE INVENTION

A primary objective of the invention is to provide new methods, systems, apparatus and devices to improve fault-tolerance of programmable logic devices such as Field Programmable Gate Arrays, Field Programmable Transistor built-in testing and reconfiguration for autonomous fault detection and self-repair when a failure occurs during operation A secondary objective of the invention is to provide new methods, systems, apparatus and devices for repair of programmable logic devices without test equipment or human intervention while allowing the fault-stricken field programmable logic devices to remain partially operational while being repaired.

A third objective of the present invention is to provide new methods, systems, apparatus and devices to include a discrepancy mirror for self-testing wherein the output produced by the discrepancy always indicates the fault-free nature of the hardware comprising the circuits-under-test as well as the detector itself.

A fourth objective of the invention is to provide new methods, systems, apparatus and devices to provide self-repair and refurbishment of field programmable logic devices. that integrates competition and evolution wholly within the FPGA's normal data throughput processing flow to eliminate the need for additional function or resource test vectors.

A fifth objective of the invention is to provide new methods, systems, apparatus and devices to provide a novel fitness assessment approach via pair-wise discrepancy detection without a pre-conceived oracle for correctness.

A sixth objective of the invention is to provide new methods, systems, apparatus and devices that integrate detection, isolation, diagnosis, and recovery phases of fault-handling into a single operational flow, wherein both transient and permanent faults are handled by the same process.

A seventh objective of the present invention is to provide new methods, systems, apparatus and devices wherein during run-time, these individuals compete for selection for the preferred device configuration based on a fitness function favoring fault-free behavior.

An eighth objective of the present invention is to provide new methods, systems, apparatus and devices that enables the evolution of a customized fault-specific repair, realized directly as new configurations using the reconfigurable device's normal throughput processing operations.

A first preferred embodiment of the invention provides a programmable logic device having autonomous self-repair capabilities. The self-repairing programmable logic device includes plural reconfigurable resources and a first set of instructions for initializing the plural reconfigurable resources into plural individual configurations, wherein the plural individual configurations are paired into first and second half-configurations. Plural checkers paired with the paired half-configurations to check the outputs of the plural individual configurations and a second set of instruction detect faults and autonomously repairs the faults. The second set of instructions integrates detection, isolation, diagnosis, and recovery phases of fault-handling into a single low overhead operational flow, wherein both transient and permanent faults are handled by the same process.

In a second embodiment of the invention, the programmable logic device checkers include a first and second exclusive NOR logic gate for receiving a first and second output from the paired half-configurations to produce a first and second result, respectively and a first and a second buffer for receiving an opposite one of the first and second results, the first and second buffer enabled by the first and second result, respectively, wherein if the first and second result agree the buffer is enabled so that a buffer output indicates the fault-free nature of the paired half-configurations and the paired checkers.

Self-repair of reconfigurable logic devices during normal operation includes the steps of initializing the programmable logic device wherein resources on the programmable logic devices are portioned into individuals, selecting a first and a second individual as a pair of half-configurations, wherein each individual in the pair of half-configurations is functionally equivalent and physically distinct, detecting a fault in the pair of half-configuration, and adjusting a fitness of the pair of half-configurations and marking the pair of half configurations as one of pristine, suspect, under repair and refurbished, wherein if the fault did not occur the fitness is adjusted upward and if the fault did occur the fitness if adjusted downward. The fault determining and fitness adjustment steps are repeated if a fault did not occur. If a fault did occur, a genetic operators is invoked for reconfiguring one of the first and second individual to repair the fault stricken individual.

Further objectives and advantages of this invention will be apparent from the following detailed description of preferred embodiments which are illustrated schematically in the accompanying drawings.

DESCRIPTION OF THE PREFERRED EMBODIMENTS

Figure 1:
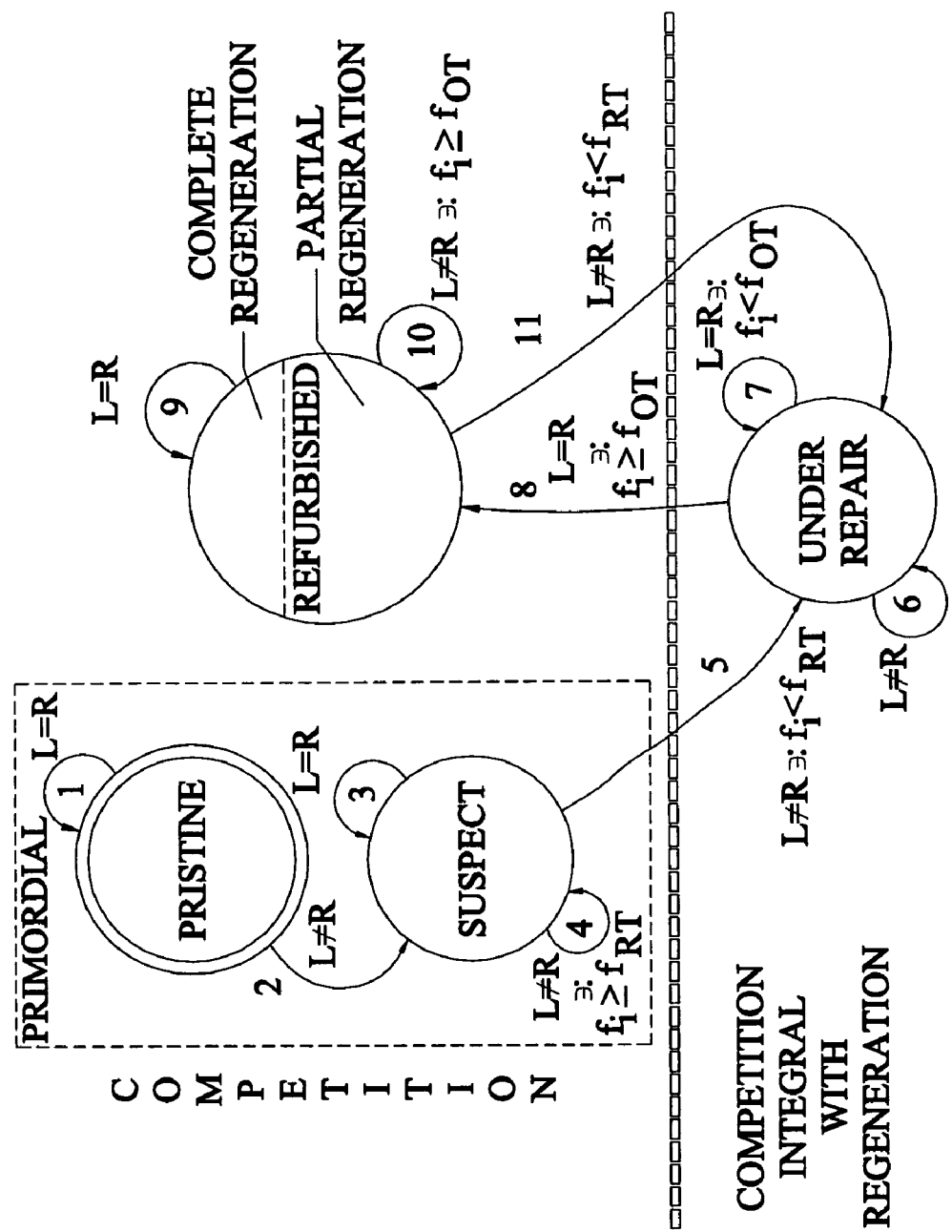
FIG. 1 is a state diagram of the relative health states in a dynamic population of competing field programmable gate array configurations when using competitive runtime reconfiguration to realize autonomous fault handling and self-repair.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

| | |
|---|---|
| 1 | pristine L = R |
| 2 | suspect L ≠ R |
| 3 | suspect L = R |
| 4 | suspect L ≠ R, $f_i \geq f_{RT}$ |
| 5. | under repair L ≠ R, $f_i < f_{RT}$ |
| 6 | under repair L ≠ R |
| 7 | under repair L = R, $f_i < f_{OT}$ |
| 8 | refurbished $f_i \geq f_{OT}$ |
| 9 | refurbished L = R |
| 10 | refurbished L ≠ R, $f_i \geq f_{OT}$ |
| 11 | under repair L ≠ R, $f_i < f_{RT}$ |
| 100 | SRAM-based FPGA |
| 102 | input data |
| 104 | output data |
| 110 | L half-configuration |
| 112 | L function logic |
| 113 | L input |
| 114 | L discrepancy checker |
| 115 | L exclusive NOR |
| 116 | L buffer |
| 120 | R half-configuration |
| 122 | R function logic |
| 123 | R input |
| 124 | R discrepancy checker |
| 125 | R exclusive NOR |
| 126 | R buffer |
| 130 | SRAM |
| 140 | reconfiguration algorithm |

It would be useful to discuss the meanings of some words used herein and their applications before discussing the invention including:

Resource—one or more programmable logic or interconnection elements

Individual—configuration that is functionally identical, same input and same output, and physically distinct resource Half-configuration—one of two individual resources that are paired for competition runtime reconfiguration Inspection interval—period between when outputs are checked EW—evaluation window $fi$—fitness $fRT$—repair threshold $fOT$—operational threshold The methods, systems, apparatus and devices of the present invention provide self-repair of reconfigurable devices of programmable gate arrays that encounter faults during operation. Self-repair is especially useful for mission-critical applications involving long missions where capacity for spare devices may be limited or absent.

For the purpose of illustration, and not limitation, the autonomous self-repair methods, systems, apparatus and devices are shown and described for SRAM-based FPGAs. The self-repair is based on Competitive Runtime Reconfiguration (CRR) which integrates detection, isolation, diagnosis and recovery phases of fault handling into a single low overhead operational flow, wherein both transient and permanent faults are handled by the same process. Under the CRR technique, an initial population of functionally identical (same input-output behavior), yet physically distinct (alternative design or place-and-route realization) individual FPGA configurations are produced at design time.

Fault handling lifecycle support is accomplished using a pair-wise comparison to detect faults against a diverse population of competing configuration alternatives. At runtime, these individuals compete for selection based on a fitness function that favors fault-free behavior. Because a fitness function is used that favors fault-free behavior, the FPGA's normal input data stream can be used evaluate fitness. This also ranks competing alternatives with regard to their relative performance to provide graceful degradation even in the presence of multiple faults. Any individual exhibiting an operationally-significant fault decreases the fitness of those configurations that use it.

CRR integrates competition and evolution wholly within the FPGA's normal data throughput processing flow to eliminate the need for additional test vectors. The genetic operator of crossover isolates the failed physical resource, and through CRR, the presence of the fault becomes occluded from the visibility of subsequent operations. Alone or with mutation, CRR realizes a failure-specific repair during normal operations to make detailed physical failure mode diagnosis unnecessary.

To repair the detected fault, offspring are formed through crossover and mutation of faulty and viable configurations. The offspring formed are reintroduced into the population. This enables evolution of a customized fault-specific repair, realized directly as new configurations using the FPGA's normal throughput processing operations. FPGA-based multipliers are examined as a case study demonstrating evolution of a complete repair for a 3-bit×3-bit multiplier from several stuck-at-faults within a few thousand iterations. Repairs are evolved in-situ, in real-time, without test vectors, while allowing the FPGA to remain partially online.

FIG. 1 is a state diagram showing the relative health states in a dynamic population of competing FPGA configurations under CRR according to the present invention. Initially, a population of Pristine individual configurations is created. These primordial configurations are functionally-identical, same input-output behavior, yet utilize physically-distinct resources, alternative design or place-and-route implementation. To describe and illustrate the process, consider the FPGA physical arrangement shown in FIG. 2 which shows two competing half-configurations 110 and 120 labeled Functional Logic Left (L) and Functional Logic Right (R) loaded in tandem. To keep the device count to a minimum, competing configurations left L 110 and right R 120 half-configurations can be stored in the same EEPROM device 130 that is already required to boot the SRAM-based FPGA 100. Alternatively, the competing configurations left L 110 and right R 120 half-configurations can be maintained in an external RAM (not shown). The SRAM 130 also stores the configuration data used to boot the SRAM-based FPLGA from cold start and also includes a program for controlling the operation of the FPLA.

The SRAM-based FPGA 100 has an input port for input data 102 and an output port for output data 104. The input and output ports allow the FPGA to communicate with other components within the system. Each competing half-configuration 110 and 120, include function logic 112 and 122 and a discrepancy checker 114 and 124 for comparing the outputs of the left and right function logic 112 and 122, respectively. The output of the discrepancy checkers 114 and 124 are the output data 104 and are fed into the reconfiguration algorithm 140 which processes the results and determines the health of the L and R function logic 112 and 122.

A common problem in designing fault detection schemes is that the detector itself may fail, or be subject to faults. In an embodiment of the invention, the error detection circuit is a discrepancy mirror for the detection of faults in both the circuit under test (left L 110 and right R 120 half-configurations) and the error detection circuit. The discrepancy mirror improves upon existing techniques for fault detection by ensuring that the fault detection circuit is also self-testing. In other words, the output produced by the discrepancy mirror always indicates the fault-free nature of the hardware comprising the left L or right R half-configuration as well as the error checker itself.

Figure 2:
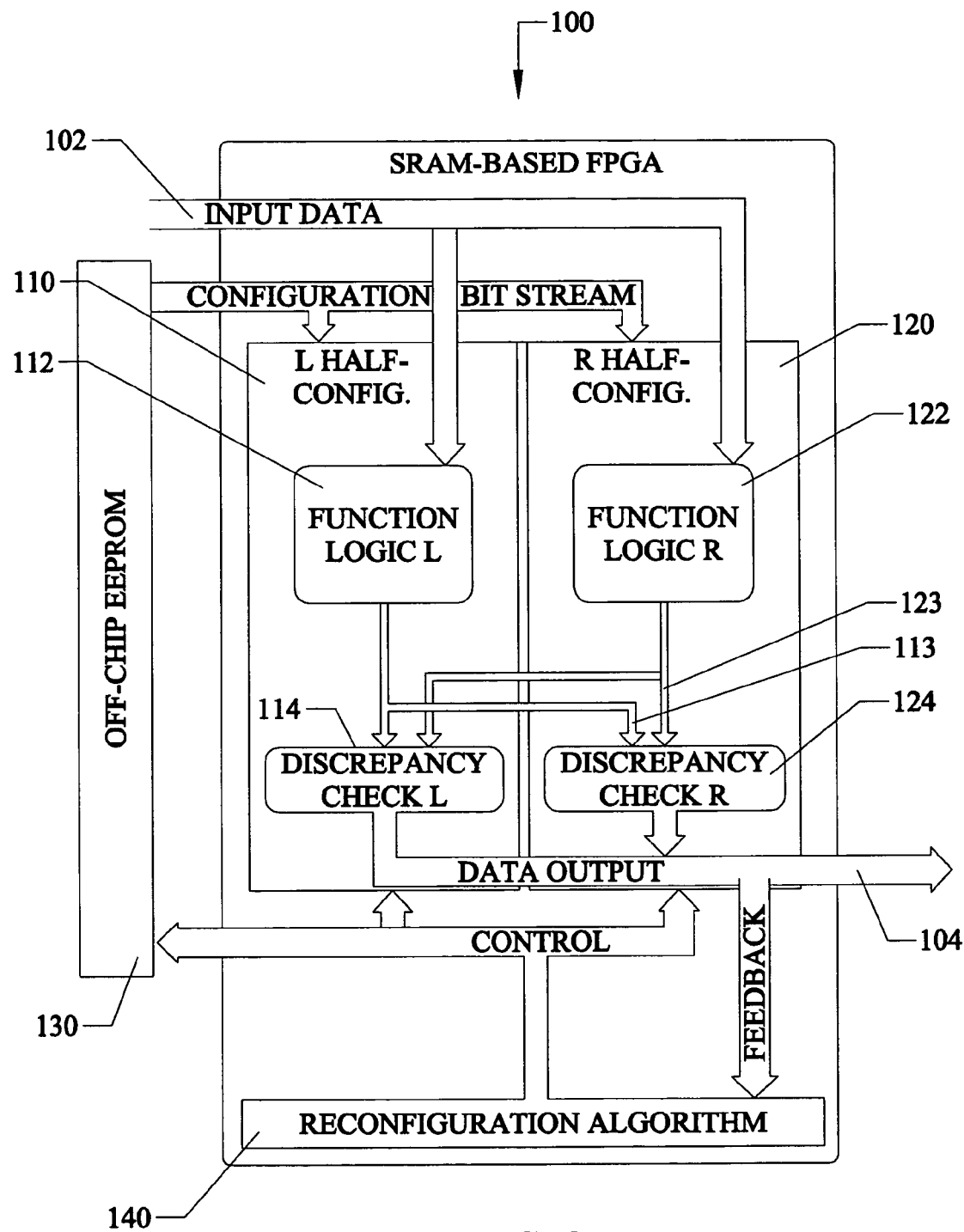
FIG. 2 shows an example of the fitness assessment approach using pairwise discrepancy detection for competitive runtime reconfiguration in a SRAM-based reconfigurable logic device.
Figure 3:
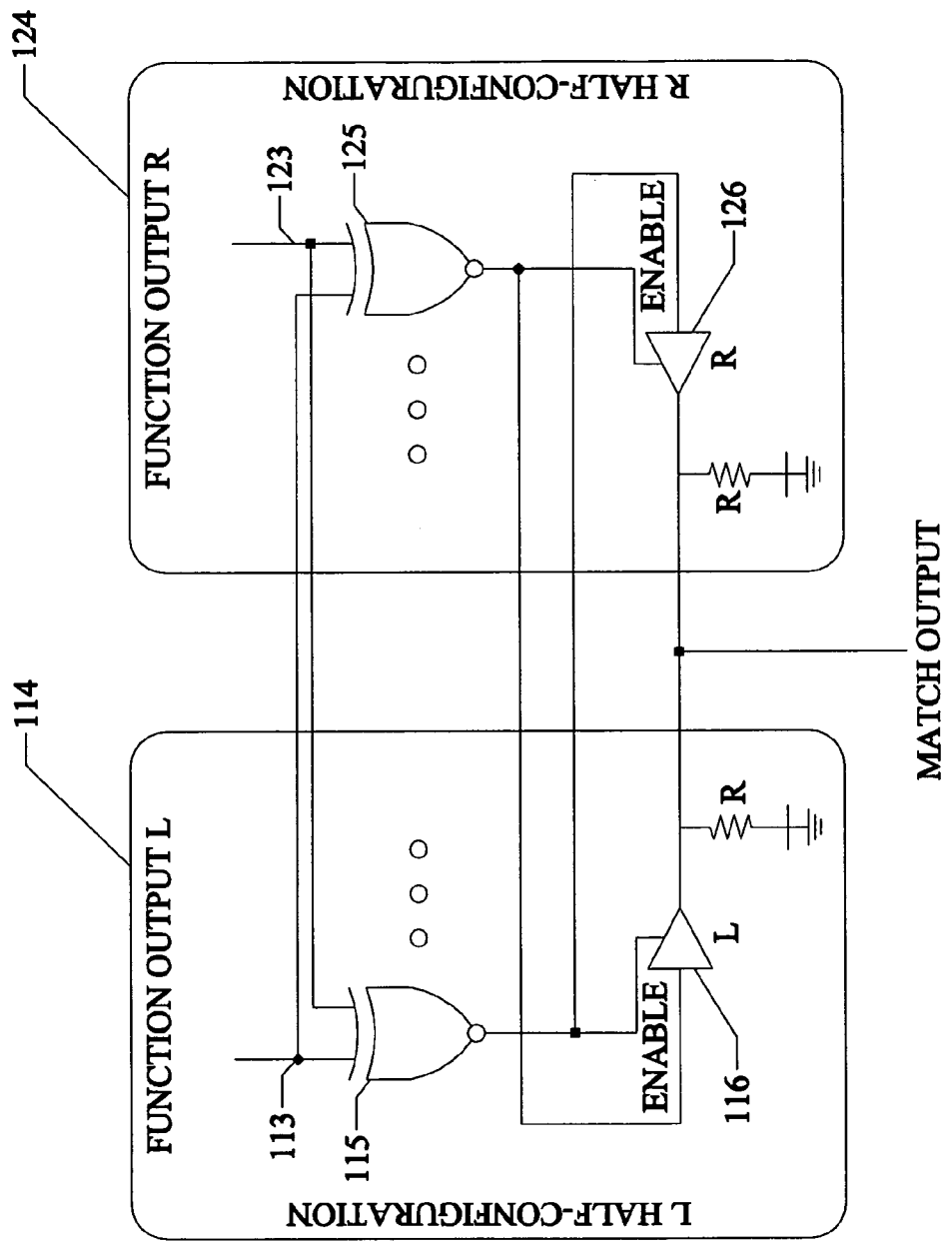
FIG. 3 is a schematic diagram of a discrepancy mirror error detection circuit according to an embodiment of the present invention.

The discrepancy mirror circuit is shown in FIG. 3. As shown in FIG. 2, each half-configuration 110 and 120 contains a discrepancy checker 114 and 124. In an embodiment of the invention, the discrepancy checkers 114 and 124 utilize bitwise Exclusive NOR gates 115 and 125 as shown in FIG. 3 to determine equivalence at each bit of the left and right function outputs 113 and 123, respectively. If and only if the left L half-configuration discrepancy checker 115 finds bitwise agreement will it enable the discrepancy checker 125 output of the right R half-configuration 124 using a Tri-State buffer 116, and vice-versa.

TABLE I

| Component | Fault Scenarios | | | | Fault-Free |
|---|---|---|---|---|---|
| Function Output L | Fault | Correct | Correct | Correct | Correct |
| Function Output R | Correct | Fault | Correct | Correct | Correct |
| $XNOR_L$ | Disagree (0) | Disagree (0) | Fault: Disagree (0) | Agree (1) | Agree (1) |
| $XNOR_R$ | Disagree (0) | Disagree (0) | Agree (1) | Fault: Disagree (0) | Agree (1) |
| $Buffer_L$ | 0 | 0 | 1 | 0 | 1 |
| $Buffer_R$ | 0 | 0 | 0 | 1 | 1 |
| Match Output | 0 | 0 | 0 | 0 | 1 |

Table 1 show the fault coverage for discrepancy mirror. Match output determination uses a default of match output=0 (where 0 indicates no match) being the match signal at ground using a pull-down resistor R. Table 1 indicates fault coverage such that if both discrepancy checkers 114 and 124 agree then no visible single fault occurred anywhere in the data path nor the checker/buffer 115/116 and 125/126 of either half-configuration. Hence, the error checking circuitry itself also competes to exhibit fault-free-behavior. An error in the checker decreases that configuration's fitness so that it is avoided during subsequent selection.

Referring back to FIG. 1, when output discrepancies occur in operations performed by the FPGA, transitions in the health state of the competing L and R half-configurations occur. The transitions in the health state of the competing half-configurations are labeled by the arcs numbered 1-11. The state transition arrows labeled L=R and L≠R indicate whether the two resident half-configurations produce either matching or discrepant outputs, respectively. For example, when L=R occurs under the transition event 1, both individuals retain their Pristine state. However when their outputs disagree, L≠R, then transition 2 occurs. Both L and R half-configurations are demoted to the Suspect pool and the fitness value of both individuals is decreased. Whenever transition 2 occurs, a Fault Alert indicator is issued because two functionally-identical circuits disagree indicating that at least one resource fault must have occurred.

Conversely, whenever two half-configurations agree, the fitness value of both half-configurations is raised. By repeated pairing over a period of time, only those half-configurations which do not use faulty resources will eventually become preferred because the fitness of a faulty half-configuration is always decreased regardless of its pairing, yet fitness of fault-free half-configurations which are paired together are increased.

Any physical resource exhibiting an operationally-significant fault automatically decreases the fitness of those configurations which use it. This process occurs as part of the normal processing throughput of the FPGA without requiring any supplemental test vectors or other diagnostics. The determination of a configuration's health state is based on its cumulative correctness performance relative to threshold values over a period of random samples called the Evaluation Window, denoted by $E^W$.

More formally, the i-th half-configuration remains in the Suspect pool until its fitness $fi$ evaluated over the preceding $E^W$ pairings drops below the Repair Threshold $f_{RT}$ such that $fi<f_{RT}$. The i-th half-configuration is then marked as Under Repair until its fitness $fi$ rises above the Operational Threshold $f_{OT}$ such that $fi \geq f_{OT}$ through the application of genetic operators. Normally, $f_{OT}$ is selected such that $f_{OT}>f_{RT}$ which provides dithering immunity such that the configuration is indeed Refurbished as indicated by transition 8.

Whenever instances of transition 9 occur, then the fitness $fi$ is further increased and complete regeneration becomes possible though not necessarily externally distinguishable from partial regeneration. Competing half-configurations remain Refurbished unless $fi<f_{RT}$ at which time the half-configurations are again demoted to the Under Repair state due to subsequent discrepant behavior.

Figure 4:
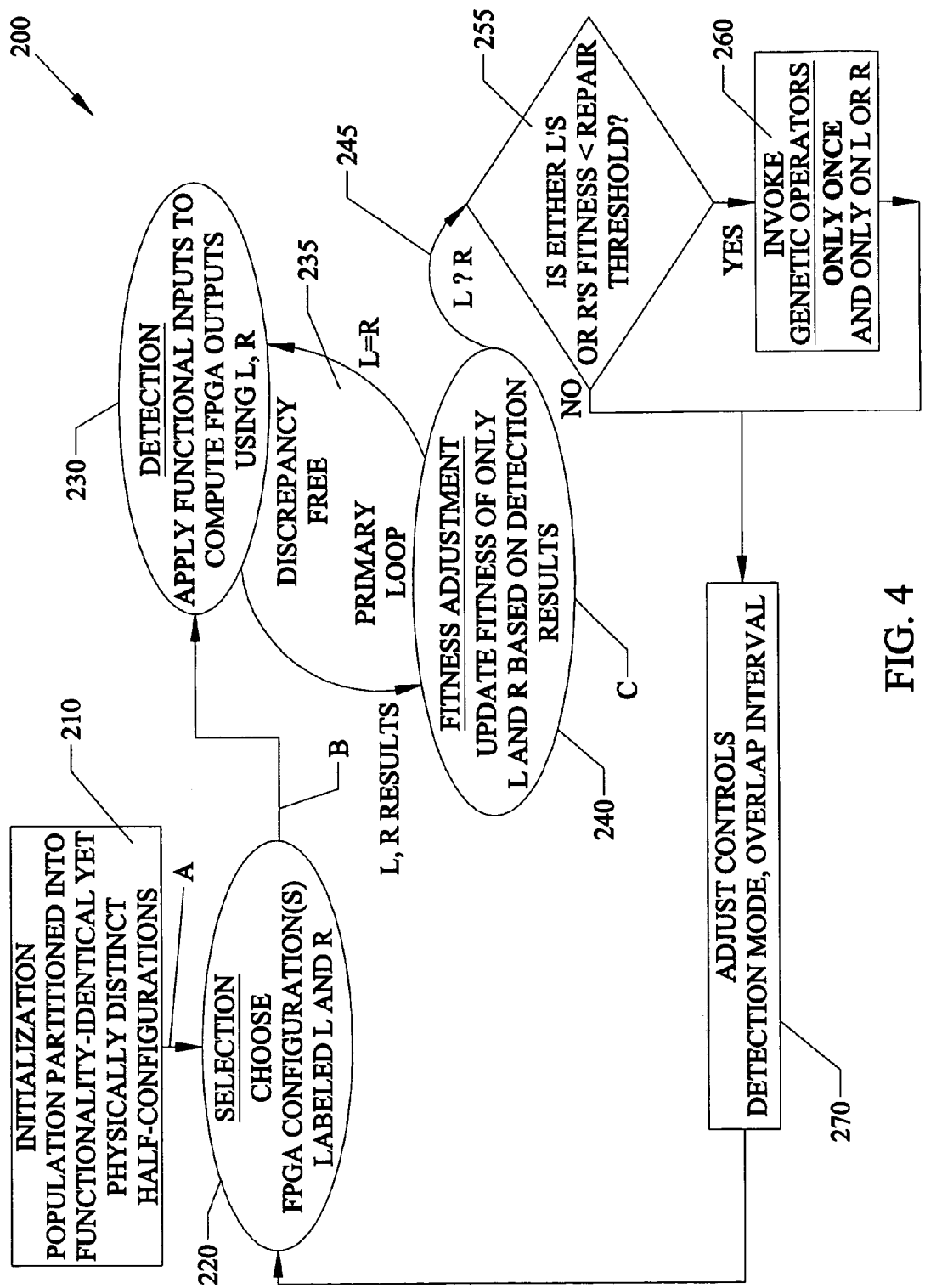
FIG. 4 is a procedural flow diagram showing the competitive runtime reconfiguration process.

FIG. 4 shows a flow diagram of the CRR process 200 that calculates the health state transitions. During the initialization step 210, the FPGA population is partitioned into functionally-identical, yet physically distinct, half-configurations. After initialization, selection of the left L and right R half-configurations occurs and the paired half-configurations are loaded into the FPGA in step 220. In step 230, the Detection process is performed when the normal data processing inputs are applied to the FPGA. Based on agreement or disagreement of the outputs of the two competing left L and right R half-configurations, Fitness Adjustment for both individuals is performed in step 240. The central primary loop 235 between Detection step 230 and Fitness Adjustment step 245 represents discrepancy-free behavior. As long as the half-configurations remain fault free, the central primary loop 235 repeats indefinitely without reconfiguration of the FPGA.

Figure 5:
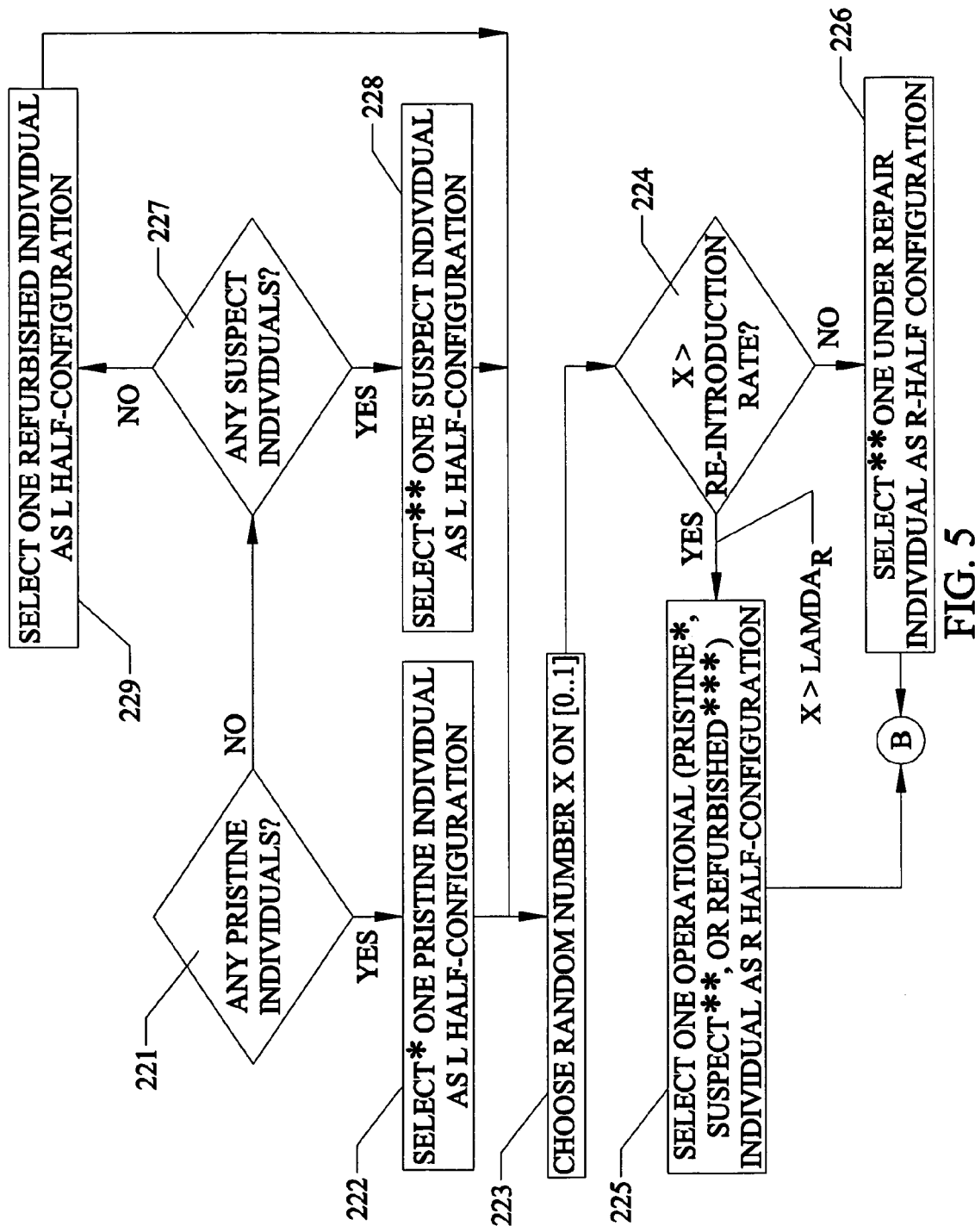
FIG. 5 is a flow diagram showing the process for selecting left L and right R half-configurations used for pair-wise discrepancy detection according to the present invention.

Alternate configurations of resources are only required when the outputs of the half-configurations disagree, as indicated by the L≠R path 245 shown in FIG. 5. If $fi<f_{RT}$ in step 255, then Genetic Operators in step 260 are invoked only once on the resident i-th half-configuration. The modified half-configuration is then immediately returned to the pool of competing configurations, controls such as detection mode and overlap interval, are adjusted in step 270, and the Selection step 220 is resumed under normal FPGA throughput processing operations. Genetic operators used include but are not limited to two-point crossover to replace functional units with designs from other viable configurations, mutation which reconfigures suspect CLBs with random alternatives, and cell swapping which moves CLBs within a configuration.

Selection Process

The Selection process in step 220 is shown in FIG. 5. Its usual flow is for Pristine, Suspect, and then Refurbished individuals to be preferred in that order for one half-configuration. In step 221, Pristine individuals are identified. If Pristine individuals are found, one Pristine individual is selected as left L half-configuration. A random number X is chosen in step 223 and in step 224, it is determined whether the chosen number X is greater than the Re-introduction rate $\lambda_R$. If X is >$\lambda_R$, then an operation for the half-configuration is selected in step 225 as one of Pristine or Refurbished individual and the half-configuration becomes a right R half-configuration.

On the other hand, the other half-configuration, right R half-configuration, is selected based on a stochastic process determined by the Re-introduction Rate $\lambda_R$. Therefore, if $X \leq \lambda_R$, the half-configuration is selected as an under repair individual as a right R half-configuration and the process proceeds to the Detection process in step 230. In particular, Under Repair individuals are selected as one of the competing half-configurations on average at a rate equal to λR. The now genetically-modified configuration is re-introduced into the operational throughput flow as a new competitor to potentially exhibit fault-free behavior against the larger pool of configurations not currently undergoing repair.

There are three selection biases employed to favor either inventory rotation, correctness, or correctness augmented with operational performance. In the latter case, inclusion of a second-order metric within the fitness function not only allows repair, but also simultaneous consideration of which competing, equally-correct configurations, exhibit better throughput or perhaps power consumption performance at no additional cost.

As shown in process diagram of FIG. 5, when a Pristine individual is not available in step 221, and Suspect individuals are identified in step 227, a Suspect individual is selected as the left half-configuration in selection step 228. If no Pristine or Suspect individual is available for selection, a Refurbished individual is selected as the left half-configuration in step 229. Once a Pristine, Suspect or Refurbished is selected in step 222, 227 or 228, respectively, the process continues to step 223 as described in a preceding paragraph to determine whether the selected half-configuration will remain a left half-selection, or be used as a right half-configuration before proceeding to the Detection step 230.

An additional innovation is that λR is not only a continuous variable, but can be adapted under autonomous control. Referring back to FIG. 1, the system strives for Mean-Time-To-Repair (MTTR)<Mean-Time-Between-Failures (MTBF) by monitoring the ratio of the number of computations elapsed between transitions 5 and 8 for MTTR, as compared to the sum of iterations between transitions 8 and 10 plus transitions 2 and 5 for MTBF and adjusting re-introduction rate λR accordingly.

Detection Process

Figure 6:
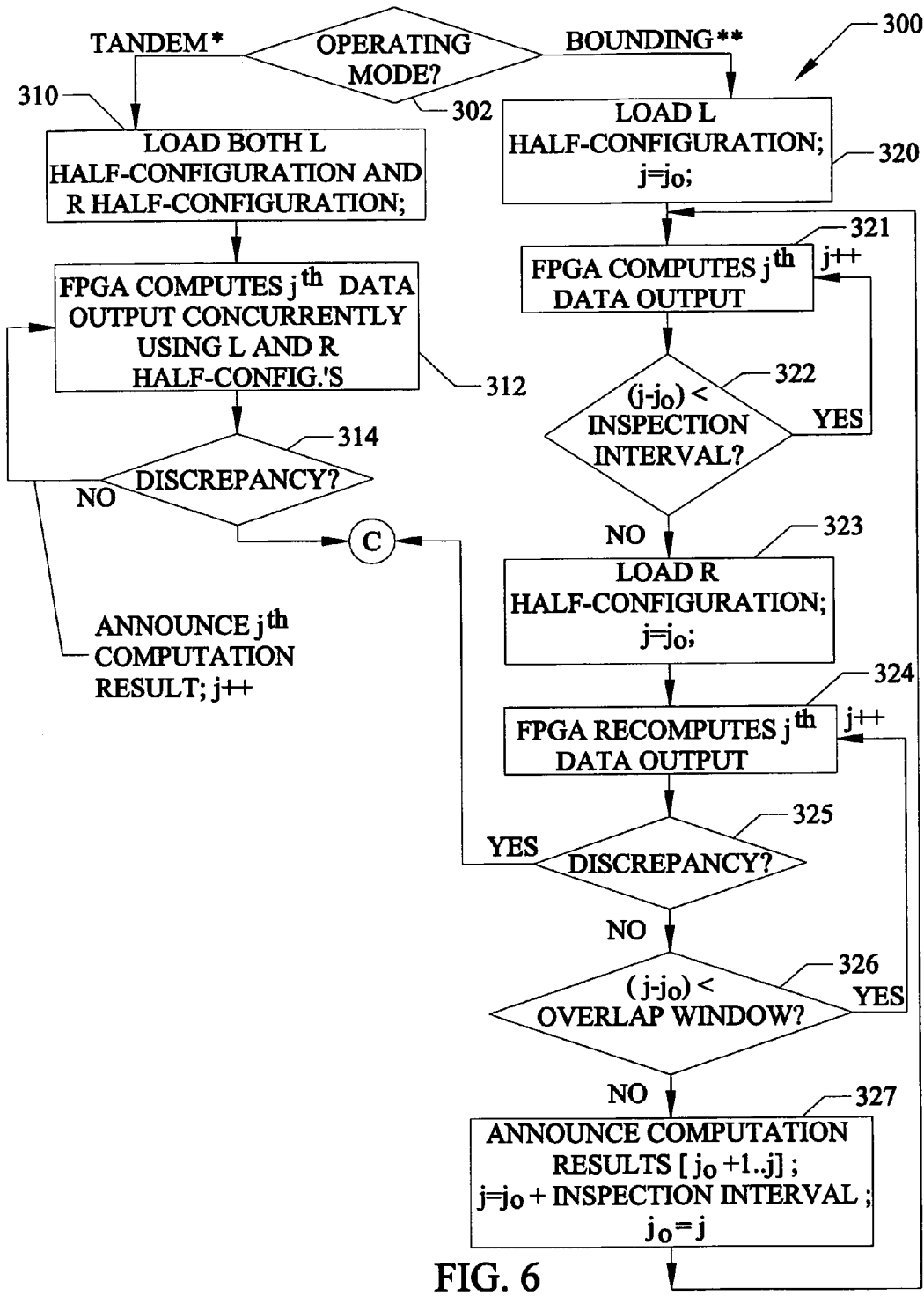
FIG. 6 is a flow diagram showing the detection process using tandem and bounding operational modes for fault-identification according to the present invention.

FIG. 6 is a flow diagram showing the Detection process of step 230. As shown, two formulations of tandem and bounding operational modes are used for fault-identification through FPGA runtime reconfiguration. In the tandem mode, not shown in FIG. 4, both the left L and right R half-configurations are loaded into the FPGA in step 310. Thus, step 310 configures the FPGA with 2 physically-distinct configurations that are functionally-equivalent so that resource failures are identified as discrepant outputs between the loaded configurations. In step 312 the FPGA computes the jth data output concurrently using the left L and right R half-configurations and in step 314 it is determined whether a discrepancy occurred. If a discrepancy is not found in step 314, the tandem operation mode loops back to the computation step 312 until a discrepancy is detected in step 314. In addition to the tandem mode presented thus far wherein both the left L and right R half-configurations are resident simultaneously, an alternative bounding mode may be substituted.

Under bounding detection, only a single configuration is resident in the FPGA at any time, allowing FPGA resource utilization close to 100%. In the bounding mode, FPGA clock frequency=(desired output frequency)·[1+(overlap window/inspection interval)]. Using nominal values, this would incur a frequency increase on the order of 0.1%, additional power of 0.1%, and a reconfiguration rate only once every several thousand outputs with negligible FPGA resources, independent of population size and diversity when stored in already required non-volatile off-chip EEPROM.

As shown in FIG. 6, one half-configuration, the left L half-configuration in this example, is loaded in step 320 wherein j=$j_0$. The bounding mode computes a contiguous run of $j^{th}$ data outputs in step 321 as bounded by the Inspection Interval. In step 322, it is determined whether j–$j_0$ is less than the inspection interval. If j–$j_0$ is less than the inspection internal, the operating mode loops back to step 321 where the $j^{th}$ data output is computed again.

If j–$j_0$ is not less than the inspection internal, FPGA is reconfigured to a different single competing configuration half-configuration, the right R half-configuration in this example, wherein j=$j_0$ in step 323. Following the same steps as described in regard to the left L half-configuration, the FPGA re-computes the $j^{th}$ data output in step 324 and checks for a discrepancy in step 325. If a discrepancy is found in step 325, the process proceeds to the Fitness Adjustment step 240 of FIG. 4. These repeated computations are only used to adjust fitness $f_i$ if a discrepancy occurs.

If a discrepancy is not found in step 325, it is determine in step 326 whether j–$j_0$ is less than the overlap window. If j–$j_0$ is less than the overlap window, the $j^{th}$ data output is redundantly computed until j–$j_0$ is not less than the overlap window. While it is not less than the overlap window, the computation results [$j_0$+1 . . . j]; j=$j_0$+inspection interval; $j_0$=j and the process repeats starting at step 321 where the $j^{th}$ data output is calculated.

There are advantages for using the tandem and the bounding operating modes. With the tandem operating mode, both half-configurations are resident simultaneously for instantaneous fault detection without pipelining; reconfiguration expense only when individuals are under repair; and when configurations are stored off-chip in the already required non-volatile EEPROM, the FPGA resource overhead is independent of population size and diversity.

With the bounding operating mode, half-configurations are resident consecutively for negligible FPGA resource overhead; adaptable detection coverage vs. power consumption; and results are buffered in one-FPGA resource overhead is independent of population size and diversity.

Fitness Adjustment and Evolution

Figure 7:
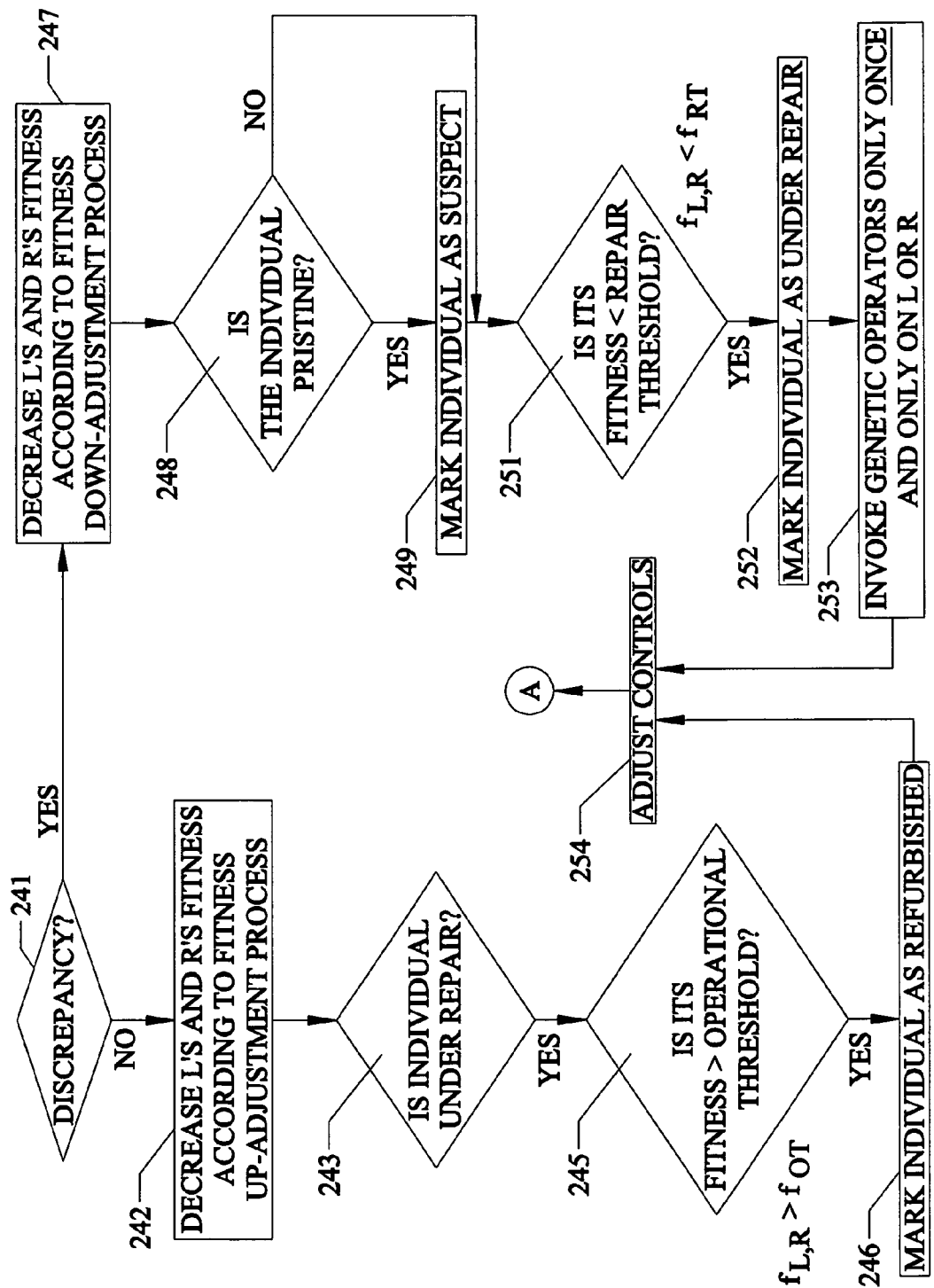
FIG. 7 is a flow diagram showing the fitness and evolutionary processes according to the present invention.

The Fitness Adjustment and Evolutionary Processes, step 240 in FIG. 4, is shown in more detail in FIG. 7. Under CRR fitness, both left L and right R half-configurations are increased in step 242 by the fitness up-adjustment procedure when their outputs agree in step 241. Alternatively, a fitness down-adjustment is made in step 247 when a discrepancy occurs in step 241. The fitness down-adjustment has a steeper gradient then the fitness up-adjustment. After the fitness of the left L and right R half-configurations has been adjusted-up, it is determined in step 243 whether the individual is under repair. If the individual is under repair, it is determine whether the fitness $f_i$ is greater than the operational threshold $f_{OT}$ in step 245. If the fitness is greater than the operational threshold, the individual, left L or right R half-configuration, is relabeled as Refurbished in step 246, the controls are adjusted in step 254 and the process returns to the selection step 220 show in FIG. 4.

If a discrepancy is found in step 241, the fitness of the left L and right R half-configurations are adjusted down in step 247. Step 248 determines if the individual is Pristine. If the individual is Pristine, the individual is relabeled as Suspect in step 249 and in step 251 it is determined whether the individuals fitness $f_{L,R}$ is less than the repair threshold $f_{RT}$. If fitness $f_{L,R}$ is less than the repair threshold $f_{RT}$, the individual is relabeled in step 252 as Under Repair and in step 253, genetic operators are invoked on one of the left L or right R half-configuration. Genetic operators are only invoked once in step 254 before the controls are adjusted in step 254 and the FPGA returns to the selection process 220 shown in FIG. 4.

When $f_i$<$f_{RT}$ in step 251, then two-point crossover with a randomly selected pristine individual and then mutation are invoked a single iteration. For crossover to occur such that offspring are guaranteed to utilize only mutually-exclusive physical resources with other resident half-configurations, the larger population is partitioned into mutually exclusive sub-populations of left L and right R. By enforcing speciation so breeding occurs exclusively in left L or exclusively in right R, non-interfering resource use is maintained. Defining $f_{RT}$ as a dynamic value proportional to the instantaneous maximum population fitness ($f_{Elite}$), such that $f_{RT}$=0.001 $f_{Elite}$ has performed well in the experiments.

Error Checking Fitness

Finally, since an instance of the XNOR checking logic 115 and 125 is embedded within each half-configuration discrepancy checker 114 and 124 as shown in FIGS. 2 and 3, the error checking circuitry itself also competes to exhibit fault-free-behavior. Hence, an error in any checker decreases that configuration's fitness. Thus the use of the faulty checker is eventually avoided during subsequent selections.

In summary, the present invention provides methods, systems, apparatus and devices to detect faults in the FPGA fabric, configuration-storing memory, and error detection circuitry which are handled via the CRR process because faulty competing functional outputs indicate discrepancy, as do configurations loaded with incorrect bit streams from configuration storing memory, and faulty XNOR comparators disagree, respectively. If any of these faults happens to be a transient, CRR's alternate pairing process will scrub the SEU(s) automatically. Fitness will be decreased initially due to transient faults, but later rise so that transients are resolved instantly and attenuated automatically over time.

While the discrepancy mirror detection circuit has been shown and described for use with the CRR for detecting faults in the left L and right R half-configurations, those skilled in the art will recognize that the discrepancy mirror circuit may be used with alternative techniques for testing and self-repair of programmable logic device.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A programmable logic device with an embedded processor core for executing instructions and memory for storing the instructions and having autonomous fault detection and self-repair capabilities during operation after the configuration process, the programmable logic device further comprising:

plural reconfigurable resources;

a first set of instructions stored in the memory and executed by the processor core for initializing the plural reconfigurable resources into plural individual configurations, wherein the plural individual configurations are paired into a pair of half-configurations;

plural checkers for checking outputs of the plural individual configurations, wherein the plural checkers are paired with the pair of half-configurations; and a second set of instruction stored in the memory and executed by the processor core for detecting faults and autonomously repairing faults in the plural individual configurations during the programmable logic device's throughput processing operations, wherein the second set of instructions integrate detection, isolation, diagnosis, and recovery phases of fault-handling into a single operational flow, wherein both transient and permanent faults are handled by the second set of instructions, for autonomous fault detection and self-repair during operation of the programmable logic device.

2. The programmable logic device of claim 1, wherein the first set of instructions comprises:

a first subset of instructions for initializing the programmable logic device wherein the plural reconfigurable resources on the programmable logic devices are portioned into plural individual configurations;

a second subset of instruction for selecting a first and a second one of the plural individual configurations as the pair of half-configurations, wherein each one of the plural individual configurations in the pair of half-configurations is functionally equivalent and physically distinct.

3. The programmable logic device of claim 1, wherein each of the paired checkers comprise:

a first and second exclusive NOR logic gate for receiving a first and second output from the pair of half-configurations to produce a first and second result, respectively; and a first and a second buffer for receiving an opposite one of the first and second results, the first and second buffer enabled by the first and second result, respectively, wherein if the first and second result agree the buffer is enabled so that a buffer output indicates the fault-free nature of the pair of half-configurations and the paired checkers.

4. The programmable logic device of claim 1, wherein the second set of instructions comprise:

a third subset of instructions for applying first and second functional inputs to the pair of half-configurations to produce a first and a second output;

a fourth subset of instructions for checking the first and second output to determine if the first and second outputs agree;

a fifth subset of instructions for adjusting a fitness of the pair of half-configurations, wherein if the first and second output agree the fitness is adjusted upward and if the first and second output disagree the fitness if adjusted downward;

repeating the third, fourth and fifth subset of instructions if the first and second output agree;

a seventh subset of instruction for invoking genetic operators for reconfiguring one half of the pair of half-configurations to repair the fault if the first and second output disagree; and looping back to the second subset of instructions, wherein the programmable logic device remains operational during the self-repair.

5. The programmable logic device of claim 1, wherein the programmable logic device comprises:

a static random access memory based field programmable gate array.

6. The programmable logic device of claim 1, wherein the programmable logic device comprises:

a field programmable transistor array.

7. A system for autonomous self-repair of reconfigurable logic devices when a fault occurs during operation after the configuration process comprising:

a reconfigurable logic device with embedded processor core and memory and having plural resources and plural error detectors;

a set of initialization instructions stored in the memory for initializing the reconfigurable logic device and partitioning the plural resources into pairs of individual half-configurations, each of the individual half-configurations routed to one of the plural error detectors; and a set of fault detection and reconfiguration instructions stored in the memory that integrate detection, isolation, diagnosis, and recovery phases of fault-handling into a single operational flow, wherein both transient and permanent faults are handled by the same process during normal throughput processing operations to allow the fault-stricken reconfigurable logic device to remain at least partially operational while being repaired.

8. The system of claim 7, wherein the paired error detectors comprise:
- a first and second exclusive NOR logic gate for receiving a first and second output from the pair of individual half-configurations to produce a first and second result, respectively; and
- a first and a second buffer for receiving an opposite one of the first and second results, the first and second buffer enabled by the first and second result, respectively, wherein if the first and second result agree the buffer is enabled so that a buffer output indicates the fault-free nature of the pair of half-configurations and the corresponding pair of checkers.

9. The system of claim 7, wherein the set of fault detection and reconfiguration instructions comprises:
- a first set of instructions for applying first and second functional inputs to the pair of individual half-configurations to produce a first and a second output;
- a second set of instruction for checking the first and second output to determine if the first and second output agree;
- a third set of instructions for adjusting a fitness of the pair of individual half-configurations, wherein if the first and second output agree the fitness is adjusted upward and if the first and second output disagree the fitness if adjusted downward;
- repeating the first, second and third set of instructions if the first and second output agree;
- a fourth set of instruction for invoking genetic operators for reconfiguring one of plural resources of the pair of individual half-configurations to repair the fault if the first and second output disagree; and
- looping back to the second set of instructions, wherein the programmable logic device remains operational during the self-repair.

10. A method for self-repair of reconfigurable logic devices with an embedded processor core for executing instructions and memory for storing the instructions, the testing and self-repair occurring during normal throughput processing operation after the configuration process, the instructions comprising the steps of:
- initializing the reconfigurable logic device wherein plural reconfigurable resources on the programmable logic devices are portioned into plural individuals;
- selecting a first and a second one of the plural individuals as a pair of half-configurations, wherein each individual in the pair of half-configurations is functionally equivalent and physically distinct;
- detecting a fault in the pair of half-configuration using duplicate paired checkers;
- adjusting a fitness of the pair of half-configurations and marking the pair of half-configurations as one of pristine, suspect, under repair and refurbished, wherein if the fault did not occur the fitness is adjusted upward and if the fault did occur the fitness is adjusted downward;
- repeating the fault determining and fitness adjustment steps if the fault did not occur;
- invoking genetic operators for reconfiguring one of the first and second individuals to repair the fault stricken one of the plural individuals if the fault did occur; and
- looping back to the selection step, wherein the programmable logic device remains operational during the self-repair of the fault-stricken programmable logic device to obtain fault-free operation.

11. The method of claim 10, wherein the selection step comprises the steps of:
- determining if any of the plural individuals in the programmable logic device are pristine;
- selecting a pristine individual as one of the first and the second individual of the pair of half-configurations if the pristine individual exists;
- selecting a suspect individual if the pristine individual does not exist;
- selecting a refurbished individual if the pristine and the suspect individual does not exist;
- choosing a random number;
- determining if the chosen random number is greater than a re-introduction rate;
- selecting one of the pristine, suspect and refurbished individual as the first individual if the chosen random number is greater than the re-introduction rate; and
- selecting an under repair individual as the first individual if the chosen random number is not greater than the re-introduction rate.

12. The method of claim 10, wherein the programmable logic device is in a tandem operating mode, the fault detection step comprising the steps of:
- applying first and second functional inputs to the pair of half-configurations to produce a first and second output; and
- checking the first and second output to determine if the first and second outputs agree, wherein a fault did not occur if the first and second output agree and a fault did occur if the first and second output disagree.

13. The method of claim 10, wherein the fitness adjustment step comprises the steps of:
- determining if a fault occurred during normal throughput processing operation;
- increasing the fitness of the pair of half-configurations if a fault did not occur;
- determining if one of the first and second individuals corresponding to the pair of half configurations is under repair;
- determining if the fitness of the under repair individual is greater than an operational threshold;
- marking the under repair individual as refurbished if the fitness of the under repair individual is greater than an operational threshold;
- decreasing the fitness of the pair of half-configurations if a fault did occur;
- determining if one of the first and second individuals corresponding to the pair of half configurations is pristine;
- marking the pristine individual as suspect;
- determining if the fitness of the suspect individual is less than a repair threshold; and
- marking the suspect individual as under repair if the suspect individual fitness is less than a repair threshold.

* * * * *